United States Patent [19]

Shannon

[11] 4,194,133
[45] Mar. 18, 1980

[54] CHARGE COUPLED CIRCUIT ARRANGEMENTS AND DEVICES HAVING CONTROLLED PUNCH-THROUGH CHARGE INTRODUCTION

[75] Inventor: John M. Shannon, Whyteleafe, England

[73] Assignee: U.S. Philips Corporation, New York, N.Y.

[21] Appl. No.: 900,910

[22] Filed: Apr. 28, 1978

Related U.S. Application Data

[63] Continuation of Ser. No. 718,885, Aug. 30, 1976, abandoned.

[30] Foreign Application Priority Data

Sep. 5, 1975 [GB] United Kingdom ............... 36701/75

[51] Int. Cl.$^2$ ....................... G11C 19/28; H01L 29/78
[52] U.S. Cl. .................................. 307/221 D; 357/24
[58] Field of Search ....................... 357/24; 307/221 D

[56] References Cited

U.S. PATENT DOCUMENTS

| | | | |
|---|---|---|---|
| 3,623,132 | 11/1971 | Green | 357/24 |
| 3,761,744 | 9/1973 | Smith | 357/24 |
| 3,852,801 | 12/1974 | Itoh et al. | 357/24 |
| 3,858,232 | 12/1974 | Boyle et al. | 357/24 |
| 3,896,485 | 7/1975 | Early | 357/24 |
| 3,918,070 | 11/1975 | Shannon | 357/24 |

FOREIGN PATENT DOCUMENTS

48-12684 2/1973 Japan.

OTHER PUBLICATIONS

Board et al. "CCFET: An Active Charge-Coupled Device" Electronics Letters, vol. II (9/18/75) pp. 452-453.

*Primary Examiner*—Gene M. Munson
*Attorney, Agent, or Firm*—Thomas A. Briody; Steven R. Biren

[57] ABSTRACT

In a CCD introduction of charge with good linearity and low signal input noise sensitivity is obtained by the control of punch-through of a depletion region associated with an input storage site to a rectifying barrier bounding a region in the semiconductor body separated from the CCD channel and forming a source of charge carriers to be stored and transported. In one form the source of charge carriers is an opposite conductivity type substrate on which is present a region of the one conductivity type in which a surface channel CCD is present. In other forms, including both surface channel CCD's and buried channel CCD's, buried layers are employed as source regions.

4 Claims, 6 Drawing Figures

CHARGE COUPLED CIRCUIT ARRANGEMENTS AND DEVICES HAVING CONTROLLED PUNCH-THROUGH CHARGE INTRODUCTION

This is a continuation of application Ser. No. 718,885, filed Aug. 30, 1976, now abandoned.

This invention relates to a charge coupled circuit arrangement comprising a charge coupled device having a semiconductor body comprising a region of one conductivity type in which charge carriers representative of information can be stored at a plurality of storage sites and transferred between successive storage sites from a first part of the region to a second part of the region, an input gate electrode being present for converting signal information into said charge carriers. The invention relates also to charge coupled devices suitable for use in such circuit arrangements.

Charge coupled devices, which may be used, for example, in delay lines for audio or video frequency signals, are described, for example, in "Electronics", May 11, 1970, page 112 et seq. and are in general based on the principle that an input signal is converted into electric charge in the device, for example a shift register, and the charge is transported to an output via a series of successive stages, the charge being each time stored in one of the stages for a certain period of time. In addition to their application in signal processing, charge coupled devices may be used in imaging applications in which case the signal input is in the form of an image which is converted into a charge pattern in a semiconductor body. However the present invention is particularly, but not exclusively, concerned with charge coupled circuit arrangements and devices for signal processing applications in which analog electrical input signals are converted into a charge pattern.

At the present time charge coupled devices (CCD's) may be generally grouped in two categories. In a first kind the structure and operation thereof is such that charge is stored at storage sites in a semiconductor body and transported through the body adjacent the surface of the body. Such devices are generally referred to as surface channel charge coupled devices. In another kind the structure and operation thereof is such that charge is stored at storage sites in a semiconductor layer which at least in operation is isolated from its surroundings and transported through the layer via the interior of the layer. Such devices are described in U.K. Patent Application No. 48980/72 which corresponds to U.S. Ser. No. 299,748, now abandoned and are sometimes referred to as bulk channel charge coupled devices.

The prior art surface channel charge coupled devices in which electrical signals are converted into discrete packets of charge at an input stage various means have been employed for obtaining an analog input of a packet of charge carriers into a storage site. In one commonly employed form the input stage comprises a surface region of the opposite conductivity type to the semiconductor body or body part in which the charge transport channel is formed, said region being situated adjacent and partly overlapped by an input gate electrode which is separated from the surface of the semiconductor body or body part by an insulating layer. The opposite conductivity type surface region forms a source of mobile charge carriers the entry of which into the first storage site of the surface channel is determined by the potential applied to the input gate electrode and the potential in the depletion as well at the first storage site.

Various different modes of operation of such structural forms of the input stage are possible with respect to the application of gating pulses and input signals. In other forms the input gate electrode is not separately provided and is effectively constituted by the charge transfer electrode associated with the first storage site. Although said prior art structures can be used to provide an analog charge input into the first storage site the problem exists that it is difficult to obtain an input of charge which varies linearly with the input signal.

Similar problems have been found to occur with the input stages used so far for charge coupled devices in which the structure and operation is such that the charge is transported via the interior of a semiconductor layer. In these devices, in which the charge is normally in the form of majority charge carriers the input stage may comprise an input gate electrode separated from the semiconductor layer by an insulating layer and an adjacent source region formed by a more highly doped surface region in the semiconductor layer. In operation a clock voltage is applied to the input gate electrode and the input signals superimposed on a fixed bias applied to the source region. As with the input stages used in surface channel charge coupled devices it is difficult to obtain good linearity and low noise sensitivity.

According to the invention, a charge coupled circuit arrangement is characterized in that the input gate electrode is separated from the first part of the region by a barrier layer and comprises an associated storage site, a further region in the semiconductor body which forms a source of charge carriers to be stored and transported being separated from the said storage site associated with the input gate electrode by at least one rectifying barrier bounding said further region, drive circuit means connected to the device for effecting the transfer of charge between storage sites, and circuit means including connections to the input gate electrode and source region for converting signal information into an input of charge into the storage site associated with the input electrode by causing a depletion region which is formed at least in part adjacent the said storage site to punch-through to the source region to effect introduction of charge carriers from said region into said storage site.

In these arrangements, by using the punch-through controlled introduction of charge from the source region various advantages arise with respect to the linearity of the charge introduction and the sensitivity to noise in an input signal as will be described hereinafter in relation to specific arrangements.

In a first form the arrangement and charge coupled device therein is for a mode of operation wherein the storage and transport of charge carriers is arranged to occur in and adjacent the surface of the region of one conductivity type, the source region being a region of the opposite conductivity type. It is in such arrangements comprising so-called surface channel charge coupled devices, such as that shown in FIG. 1, that the controlled punch-through introduction of charge in accordance with the invention is found to be particularly advantageous. Firstly, it is found that a high degree of linearity can be obtained over a range of signal input voltage extending from the threshold for punch-through up to the voltage at which the storage site is full. Secondly, it is found that the charge introduction is relatively insensitive to noise in the input signal. The latter property may readily be ascribed to the mechanism whereby the charge introduction occurs on obtaining punch-through to the rectifying barrier bounding the source region as will be more fully described hereinafter.

A charge coupled device suitable for use in the said first form of the arrangement may comprise a semiconductor body having a semiconductor layer of one conductivity type present on a substrate of the opposite conductivity type, electrode means present adjacent the surface of the layer of the one conductivity type for receiving voltages and enabling electric fields to be generated in the layer by means of which charge can be transported in and adjacent the surface of the layer from a first part of the layer to a second part of the layer, an input gate electrode separated from the first part of the layer by a barrier layer, and ohmic connections to the layer of the one conductivity type and the substrate of the opposite conductivity type. See, for example, FIG. 1. This surface channel charge coupled device may be readily formed by conventional technology and differs from prior art structures in so far as the surface channel is formed in a semiconductor layer of one conductivity type present on a substrate of the opposite conductivity type and the input stage does not of necessity require an additional surface region of the opposite conductivity type. Such a device may be constructed for conventional charge transfer operation, for example as a delay line. However, the structure may also be employed in a novel form of charge transfer device as described in our co-pending Patent Application No. 55563/72, which corresponds to U.S. Pat. No. 3,918,070, wherein field effect transistor read-out means are present at a plurality of locations in the first part of the layer of the one conductivity type. Such charge transfer devices may be referred to as charge coupled field effect transistor devices (CCFET's).

Another charge coupled device suitable for use in the said first form of the arrangement comprises a semiconductor body having a surface region of one conductivity type, electrode means present adjacent the surface of the region of the one conductivity type for receiving voltages and enabling electric fields to be generated in the region by means of which charge can be transported in and adjacent the surface of the region from a first part of the region to a second part of the region, an input gate electrode separated from the first part of the region by a barrier layer, a source region comprising a buried layer of the opposite conductivity type extending in the semiconductor body at least locally below the input gate electrode and spaced from the region of the one conductivity type, and ohmic connections to the body part comprising the surface region of the one conductivity type and to the buried layer of the opposite conductivity type. See, for example, FIG. 3. The buried layer of the opposite conductivity type may be provided in various different forms. In one form it is present between an epitaxial surface layer of the one conductivity type in which the surface charge transfer channel is formed, and a substrate region also of the one conductivity type, means being present for contacting the buried layer of the opposite conductivity type. In another form the buried layer of the opposite conducitivity type is formed by localized ion implantation in a body of the one conductivity type and means are present for contacting the ion implenated buried layer.

In a preferred arrangement comprising one of the said charge coupled devices constructed for operation as a surface channel device means are present for connecting the semiconductor body part of the one conductivity type in which charge storage and transport is effected and the semiconductor body part of the opposite conductivity type forming the source of charge carriers at the same potential, and means are present for applying input signal information to the input gate electrode. Thus, for example, in the device comprising a charge storage and transport surface layer of one conductivity type present on a substrate of the opposite conductivity type, the layer and substrate are simply connected at the same potential, for example earth potential, and the input signal applied to an insulated input gate electrode. See for example FIG. 1. In a circuit arrangement comprising such a device in which the introduction of charge requires a depletion region to periodically extend across the thickness of the layer of the one conductivity type it will be necessary to provide fairly large voltage swings in the potential applied to the input gate electrode in order to obtain the desired further transfer of the introduced charge. For converting an analog input signal with a series of packets of charge various possibilities exist with respect to the level of sampled signals derived from the input signal and any D.C. bias applied to the input gate electrode. In general the sampled signals are in the form of square-wave pulses of different magnitude and in appropriate synchronization with the clocking voltages used for the charge transport. Although it is possible to derive such sampled signals as pulses of sufficient magnitude that no D.C. bias is required, said sampled signals alone being applied to the input gate electrode, a preferred mode of operation is where there is applied to the input gate electrode the sampled signal pulses superimposed on a D.C. level, for example a D.C. level which corresponds to the punch-through voltage. In some forms of the device in which large voltage swings are not required to achieve the desired compatibility of the charge introduction and succeeding charge transfer the D.C. level may be in the form of a constantly applied D.C. bias or the input gate electrode.

Instead of applying the sampled signals to the input gate electrode with the semiconductor region of the one conductivity type and the source region of the opposite conductivity type connected at the same potential it is possible to apply the sampled signals to the source region with the input gate electrode at a constant potential.

In another form of a surface channel charge coupled device suitable for use in the said first form of the arrangement a plurality of input gate electrodes are present at spaced positions of the first part of the layer of the one conductivity type and each separated from the semiconductor layer by a barrier layer. In this manner, if desired, controlled punch-through of depletion regions can be employed to add fixed amounts of charge at various intermediately situated storage sites between an input stage at the first part of the layer and an output stage at the second part of the layer.

Figure 5:
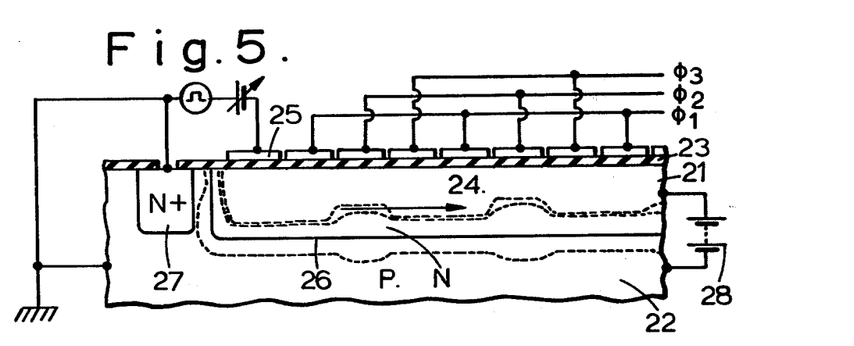
FIG. 5 shows a fourth embodiment of an arrangement in accordance with the invention and including a cross-sectional view of part of a buried channel charge coupled device present in said arrangement.

In a second form of the charge coupled circuit arrangement in accordance with the invention the transport of charge carriers is arranged to occur via the interior of the region of one conductivity type, said region at least during operation being isolated from the surroundings thereof, the source region being of the same conductivity type as said region in which charge storage and transport is effected and being separated therefrom by a region of the opposite conductivity type, as shown, for example, in FIG. 5.

In an arrangement comprising such a 'buried channel' charge coupled device the controlled punch-through introduction of charge may be advantageous because when using this mode of introduction the sensitivity to noise in an input signal may be relatively low and furthermore at least for the introduction of small packets of charge into the storage site relatively good linearity with respect to the applied signal voltage may be obtained.

One charge coupled device suitable for use in a second form of the arrangement comprises a semiconductor body having a surface layer of one conductivity type, said layer having a thickness and doping concentration such that a depletion region can be obtained throughout the thickness of the layer by means of an electric field while avoiding breakdown, an electrode system present at least at one side of the layer for the capacitive production of electric fields in the layer by means of which charge can be transported from a first part of the layer to a second part of the layer in the lateral direction of the layer via the interior of the layer, an input gate electrode separated from the first part of the layer by a barrier layer, said layer of the one conductivity type being laterally bounded in the semiconductor body at least in the vicinity of the location of the input gate electrode by a region of the opposite conductivity type, said region of the opposite conductivity type separating the first part of the layer from a surface region of the one conductivity type forming the source region, and ohmic connections at least to the source region and to the region of the opposite conductivity type.

Another charge coupled device suitable for use in a second form of the arrangement comprises a semiconductor body having a surface layer of one conductivity type and an underlying body part of the opposite conductivity type, said layer being laterally bounded in the semiconductor body and having a thickness and doping concentration such that a depletion region can be obtained throughout the thickness of the layer by means of an electric field while avoiding breakdown an electrode system present adjacent the surface of the layer for the capacitive production of electric fields in the layer by means of which charge can be transported from a first part of the layer to a second part of the layer in the lateral direction of the layer via the interior of the layer, an input gate electrode separated from a first part of the layer by a barrier layer, a source region comprising a buried layer of the one conductivity type extending in the said underlying body part of the opposite conductivity type at least below the input gate electrode, and ohmic connections at least to the source region of the one conductivity type and to the semiconductor body part of the opposite conductivity type. See, for example, FIG. 6.

In a preferred circuit arrangement comprising one of the latter two charge coupled devices means are present for connecting the source region of the one conductivity type and the semiconductor body part of the opposite conductivity type at the same potential, and means are present for applying input signal information to the input gate electrode.

Embodiments of the invention will now be described, by way of example, with reference to the accompanying diagrammatic drawings, in which.

Figure 1:
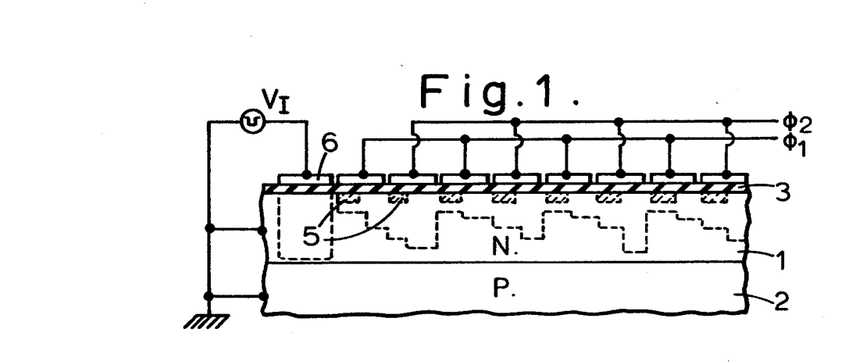
FIG. 1 shows a first embodiment of an arrangement in accordance with the invention and including a cross-sectional view of part of a surface channel charge coupled device present in said arrangement.

Referring now to FIG. 1 there is shown part of a surface channel charge coupled device. The device comprises an n-type silicon layer 1 present on a p-type silicon substrate 2. For the purpose of illustration the device is shown as a two-phase CCD in which present on an insulating layer 3 on the surface of the layer 2 there is a system of electrodes alternately connected to clock lines to which clock voltages $\phi_1$ and $\phi_2$ are applied. It will be understood however that the arrangements and devices in accordance with the invention can also be suitably constructed for different forms of operation, for example with three phase clock voltages. Furthermore in FIG. 1 and in the drawings of the following embodiments there is not shown the output means of the charge coupled device at the end of the charge transfer line because said means form no essential part of the inventive concept and may be provided in a variety of different ways in a conventional manner according to the specific application of the arrangements and devices included therein.

In FIG. 1 the structural means in the device whereby the device is suitable for operation with two-phase clock voltages comprise, in addition to the system of transfer electrodes, a plurality of more highly doped n-type implanted surface regions 5, each located in the direction of charge transport under the leading edge of an above-situated transfer electrode. It will be appreciated that this means of obtaining the two-phase operational structure is not essential and such a structure may be realized in ether ways, for example by employing different insulating layer part thicknesses under the transfer electrodes.

On the insulating layer 3 adjacent the first transfer electrode there is an input gate electrode 6 to which sampled signals derived from an analog input signal can be applied.

The operation of the arrangement as shown in FIG. 1 will now be described so far as is relevant to the conversion of an analog input signal into discrete packets of charge which are transported from a first part of the n-type region 1 to a second part (not shown) at which output signals are derived. For the preferred mode of operation now to be described the n-type region 1 is shorted to the p-type substrate 2 as shown in FIG. 1 but it is also possible to achieve a desired punch-through introduction of charge which varies linearly with the input signal when the p-n junction between the n-type region 1 and the p-type substrate has an applied reverse bias.

For the device shown in FIG. 1 in which the p-type substrate 2 has a resistivity of 20 ohm. cm, the n-type layer 1 has a resistivity of 5 ohm. cm and a thickness of 4 microns, and the insulating layer 3 has a thickness of 0.12 microns, the punch-through voltage, that is the negative voltage applied between the input gate electrode 6 and the substrate 2 at which the depletion region formed in the n-type region under the input gate electrode 6 extends in contact with the p-type substrate 2 is 15 volts. When the voltage on the input gate electrode 6 reaches this voltage then any further increase in the voltage applied to the input gate electrode will forward bias the p-n junction between the p-type substrate 2 and the n-type layer 1 and holes will be injected from the substrate into the depletion region in the n-type layer 1. As the voltage on the input gate is increased then the increase in the depletion region associated with the input gate electrode has an effect on the small depletion region in the layer associated with the zero-biased p-n junction between the layer and substrate whereby said small depletion region is pushed-back towards the substrate. At this time holes are injected very rapidly into the depletion region in the layer but as this progresses then the presence of the holes injected in said depletion region has the effect of causing this depletion region to retract. This may alternatively be considered as the self re-establishment of the zero-bias depletion region associated with the substrate/layer p-n junction. This mechanism of charge introduction involves an exponential time dependence of charge injection after the onset of punch-through as the depletion region between the layer and substrate relaxes back to the zero-bias condition. Thus the initial introduction of charge is very rapid. In this manner it is possible to obtain an input of charge varies linearly with input voltage for input voltages above the punch-through voltage and below the voltage at which the storage site associated with the input gate electrode is full. Furthermore due to the mechanism by which the charge is introduced into the depletion region below the input gate electrode and hence also the storage site associated therewith this input of charge is relatively insensitive to noise in the input signal. Consider for example the introduction of charge with a voltage pulse of a certain duration applied to the input gate electrode wherein there is a large spurious spike at the commencement of the pulse. The overall effect of such a spike in the pulse will only be that the zero-bias depletion region associated with the substrate/layer p-n junction is forced back towards the substrate more strongly than would otherwise have occurred and the rate of introduction of charge increases and the depletion region relaxes more rapidly. However the total amount of charge injected during the period of the input pulse remains substantially the same.

The relative timing and synchronization of sampled signal pulses derived from analog input signal and applied to the input gate electrode 6 and the clock voltages $\phi_1$ and $\phi_2$ will now be described. In general the sampled signals are in the form of square wave pulses of a magnitude which is determined in accordance with the level of the analog input signal at the time of sampling. The form of operation is where the square wave pulses are superimposed on a D.C. level and are of sufficient magnitude to cause the depletion region formed below the input gate electrode 6 to punch-through to the p-n junction between the n-type layer 1 and p-type substrate 2. The sampled signal pulses are synchronized with the clocking voltages $\phi_1$ and $\phi_2$. Thus it is arranged that the potential applied to the input gate electrode 6 is at its most negative value, that is during the period of applying the sampled signal pulse, when $\phi_1$ is at its minimum value, that is its least negative value. Charge is then introduced into the adjoining site by reducing the potential on the input gate to a D.C. level such that the potential at the silicon surface under the input gate is more negative than that under the adjoining electrode $\phi_1$.

The arrangement shown in FIG. 1 when operated in the described manner can provide a good linearity of charge introduction in relation to the level of the sampled signal pulses. Furthermore operation is obtained with only two sources of clock voltages which is considered advantageous having regard to some other recently proposed arrangements for obtaining such linearity which require a greater number of sources of clock voltages.

Figure 2:
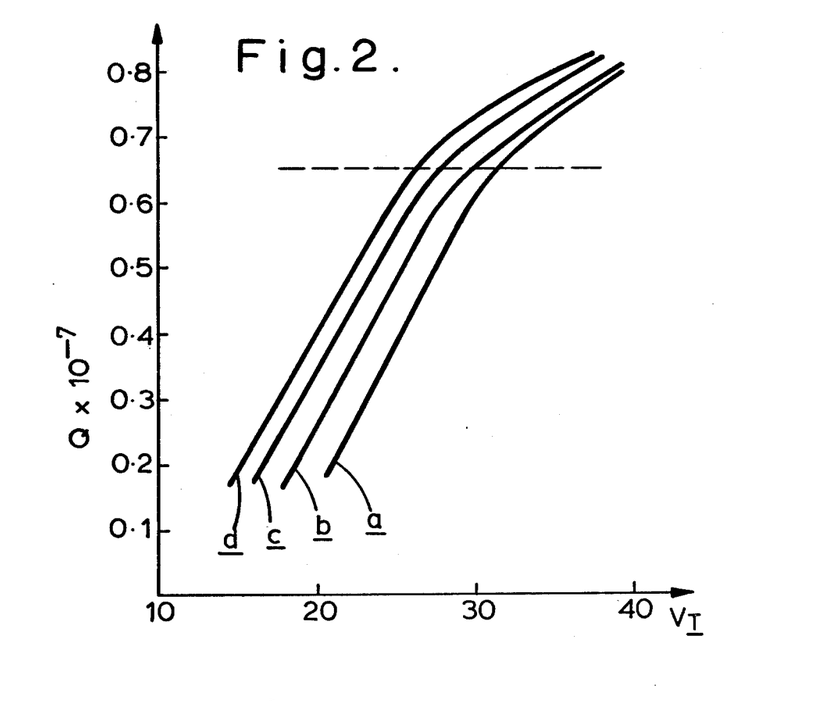
FIG. 2 is a graph showing the variation of the input of charge as a function of the magnitude of an applied input pulse in an arrangement as shown in FIG. 1.

FIG. 2 is a graph showing some experimental results when applying various input voltage pulses to the input gate electrode of a device substantially of the form shown in FIG. 1. The magnitude $v_1$ of the input pulse in volts is plotted along the abscissa and the quantity of charge, as determined by field effect transistor conductance measurements on the layer, introduced into the storage site in Coulombs per square centimeter is plotted along the ordinate. The broken horizontal line represents the maximum charge capacity of the storage site as calculated from independently made MOS capacitor threshold measurements. The four lines a, b, c, d are derived from plots made for different input voltages when applying pulses of four different fixed durations, these pulse durations being 0.2, 0.3, 1.0 and 2.0 microseconds respectively. From the plotted lines it is apparent that, in a range of input voltages between the punch-through voltage and that voltage at which the storage site is full of holes, for a pulse of a fixed duration, the amount of charge in the form of holes introduced into the storage site varies linearly according to the magnitude of the input pulse.

It will be appreciated that to achieve the desired operation whereby following introduction of charge into the storage site below the input gate electrode 6 the charge is transferred to the next adjacent storage site below part of the first transfer electrode connected to clock voltage $\phi_1$, then large swings in the voltage applied to the input gate electrode 6 will be necessary in view of the charge introduction requiring the depletion of the whole thickness of the layer 1 below the electrode 6. As already described if such large voltage swings cannot be provided by the sampled signal pulse then an additional D.C. level supply may be employed. However it is possible to form other embodiments where such large voltage swings are not required and one such embodiment of an arrangement in accordance with the invention comprising a surface channel CCD will now be described with reference to FIG. 3 of the accompanying drawings. The CCD present in this arrangement differs from that shown in FIG. 1 in that instead of providing the storage and transfer layer as a layer of one conductivity type on an opposite conductivity type substrate, in the device shown in FIG. 3 the storage and transfer layer is formed in a body 11 of a single conductivity type, in this example, a p-type body of 5 ohm.cm resistivity. The two-phase structure comprises an electrode system present on an insulating layer 13 on the surface of the body 11, this electrode system being of the same form as present in the device shown in FIG. 1. In the surface of the body 11 below the leading edges of the transfer electrodes in the direction of charge transport there are localized implanted more highly doped p-type regions 15 which are provided to enable the two-phase CCD action and extend at a depth of approximately 0.2 micron from the surface. The source for charge carriers, in this example electrons, comprises an ion implanted n+-buried layer 17 locally situated below the input gate electrode 16 and separated from the surface by a more highly doped p-type region 18 having the same doping as the regions 15. An n+-diffused region 19 extends from the surface of the body 11 in contact with the buried layer 17 and is provided with a connection conductor.

Figure 3:
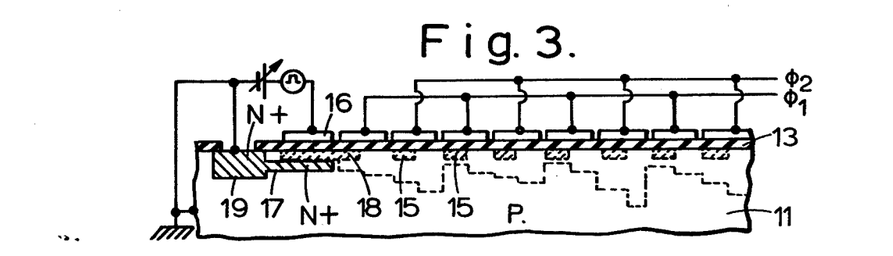
FIG. 3 shows a second embodiment of an arrangement in accordance with the invention and including a cross-sectional view of part of a different surface channel charge coupled device present in said arrangement.

Operation of the arrangement shown in FIG. 3 is similar to that shown in FIG. 1 in so far as the n+-source region 19, 17 and the p-type semiconductor body 11 are connected at the same potential, that is at earth potential. Sampled signals derived from an analog input signal and in the form of a series of square wave pulses each of a magnitude determined in accordance with the level of the analog input signal at the time of sampling are superimposed on a constant D.C. bias applied to the input gate electrode 16. In a preferred operational mode the constant D.C. bias is such that the depletion region formed below the input gate electrode 16 in the more highly doped p-type region 18 extends across the thickness of the region 18 and is just on the point of punching-through to the zero-biased p-n junction between the p-type region 18 and the n+-buried layer source region 17.

Introduction of charge into the depletion region in the p-type region 18 for input gate voltages in excess of the said punch-through voltage occurs in the same manner as described with reference to FIG. 1 and the application of sampled signals in the form of a series of pulses in synchronized with respect to the clock voltages $\phi_1$, $\phi_2$ applied to the transfer electrodes in a similar manner as described with reference to FIG. 1. In this arrangement a high degree of linearity of charge input with respect to input voltage may also be obtained together with a relatively high insensitivity to noise in the input signal.

The device shown in FIG. 3 may be formed by techniques commonly employed in the semiconductor art and by way of example some ion implantation conditions which are suitable for providing the more highly doped p-type regions 15, 18 and the n+-buried layer 17 will now be described. To obtain the n+-buried layer implantation of phosphorus ions may be effected at an energy of 200 KeV and using a dose of $5 \times 10^{13}$ ions per sq. cm. This provides a peak concentration in the implanted ion profile at approximately 0.25 micron from the surface. The more highly doped p-type regions 15 and 18 may be formed by implanting boron ions through the surface oxide layer at an energy of 60 KeV and using a dose of $8 \times 10^{11}$ ions per sq. cm.

Figure 4:
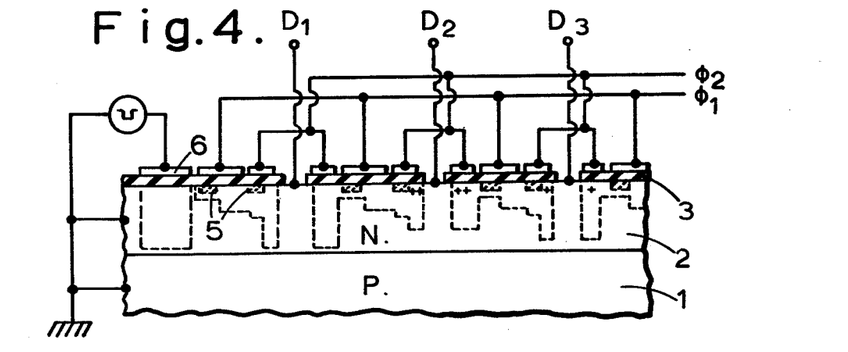
FIG. 4 shows a third embodiment of an arrangement in accordance with the invention and including a cross-sectional view of part of a charge coupled field effect transistor structure present in said arrangement.

Referring now to FIG. 4 a further embodiment of an arrangement in accordance with the invention comprising a form of surface CCD will now be described. In this arrangement the silicon device structure corresponds to that shown in FIG. 1 with the exception that each second transfer electrode has an opening and forms an annular gate of a deep depletion insulated gate field effect transistor structure having a drain centrally situated within the gate and a source formed by the layer 3. For a full description of such a device reference is invited to our co-pending Patent Application No. 55563/72 which corresponds to U.S. Pat. No. 3,918,070. FIG. 4 shows such deep depletion field effect transistor structures having drain electrode connections $D_1$, $D_2$ and $D_3$. In operation the charge stored in a depletion region below each second transfer electrode is effective in determining the channel conductance of the associated deep depletion FET structure. Thus the charge coupled FET array can be employed to give an amplified, non-destructive measure of the size of the charge packets under transfer electrodes of the CCD line. FIG. 4 shows the case where charge packets of different magnitude are stored under each second transfer electrode, the first bit having an associated FET structure with drain $D_1$ having no stored charge with the depletion region just in contact with the p-type substrate and the FET channel therefore being blocked. The second bit has an associated FET structure with drain $D_2$ having stored charge indicated by $++$ and thus the depletion region extends only partly towards the p-type substrate 12 and the FET channel is therefore unblocked. The third bit having an associated FET structure with drain $D_3$ has a smaller quantity of stored charge indicated by $+$ and thus the depletion region extends further towards the p-type substrate and the FET channel although being unblocked is smaller than in the preceding bit. Introduction of signal information charge into this device via the input gate electrode is entirely the same as described with reference to FIG. 1.

An embodiment of an arrangement in accordance with the invention in which the CCD is constructed for operation with the transfer of charge via the interior of a semiconductor layer will now be described with reference to FIG. 5. In the arrangement shown in FIG. 5 the storage and transport of majority charge carriers is arranged to occur in an n-type silicon layer formed by an island region 21 present in a p-type silicon substrate 22, the island 21 having been formed by the surface implantation and drive-in of phosphorus. Although not shown in FIG. 5 the n-type island region 21 is laterally bounded within the body on all sides by p-type material. The n-type island region 21 has such a doping that a depletion layer may be formed throughout the thickness of the region by means of an electric field without breakdown occurring. The p-type substrate 22 has a resistivity of 10 ohm.cm and the n-type island extends to a depth of approximately 4 microns from the surface. On an insulating layer 23 present on the surface of the semiconductor body there is a system of transfer electrodes for connection to a three-phase source of clock voltages $\phi_1$, $\phi_2$ and $\phi_3$. Although the device in the arrangement shown in FIG. 5 is constructed for operation with three-phase clock voltages this is not essential and in other arrangements the device structure may be suitably adapted for operation, for example with two-phase or four-phase clock voltage.

In the direction normal to the direction of charge transport as indicated by the arrow 24 the transfer electrodes extend completely across the width of the n-type island region 21.

At one end of the n-type island region 21 there is an input gate electrode 25 separated from the surface of the region 21 by the insulating layer 23. The input gate electrode 25 also extends across the entire width of the island region 21 and the leading lateral edge in the direction parallel to the surface of the region 21 is separated from the vertical part of the p-n junction 26 between the island 21 and substrate 22 by approximately 3 microns. At the surface to the p-type substrate adjacent said part of the p-n junction there is an n+-source region 27 which is provided with a connection conductor. The n+-source region 27 is spaced from the p-n junction by approximately 5 microns.

For a full description of the charge storage and transfer operation of a charge coupled device such as is shown in FIG. 5 in which the charge in the form of majority charge carriers is transported via the interior of a semiconductor layer, and having the transfer electrodes extending across the entire width of the layer, reference is invited to our copending Patent Application No. 48960/72 which corresponds to U.S. Ser. No. 299,748, now abandoned. In the particular operation of the device shown in FIG. 5 the connections and applied potentials will be such that there will exist a reverse bias across the p-n junction 26. This is schematically represented by the bias source 28 between connections to the n-type island and p-type substrate at the end of the island remote from the input gate electrode. In FIG. 5 the extent of the depletion region associated with said reverse bias during one phase of the operation is shown in the region 21 and the substrate 22 by broken lines. The device is shown at a stage in the operation when charge is stored under the transfer electrodes connected to the line $\phi_2$, the semiconductor region 21 being fully depleted under the clocking electrodes connected to the lines $\phi_1$ and $\phi_3$. The depletion regions formed under the clocking electrodes are also indicated by broken lines. This localized full depletion of the semiconductor region 21 is obtained by applying clock voltages $\phi_1$ and $\phi_3$ such that the depletion regions formed in the region 21 below the transfer gate electrodes to which said voltages are applied extend in contact with the depletion region associated with the substrate junction 26.

The mode of operation of the device in the present embodiment is shown with the n+-source region 27 shorted to the p-type body 22 and the sampled signals in the form of a series of square wave pulses applied in addition to a constant D.C. bias to the input gate electrode 25. The reverse bias existing across the p-n junction 26 and the constant D.C. bias applied to the input gate electrode is such that with no applied signal pulse to the input gate electrode the depletion region associated with the p-n junction 26 is just about to punch-through to the source region. By applying sampled signals in the form of positive pulses to the input gate electrode 25, then the depletion region associated with the p-n junction 26 will increase towards the source region 27 and charge will be injected into the input storage region at the potential minimum below the electrode 25. Thus controlled introduction of charge by punch-through of the depletion region associated with the p-n junction 26 to the n+-source region can be obtained. The synchronization of the sampled signal pulses and the clock voltage $\phi_1$ - $\phi_3$ is such that the input pulse is applied when $\phi_3$ is at its least negative value, that is when previously introduced packets of charge are present below electrodes connected to the blocking line $\phi_3$.

Figure 6:
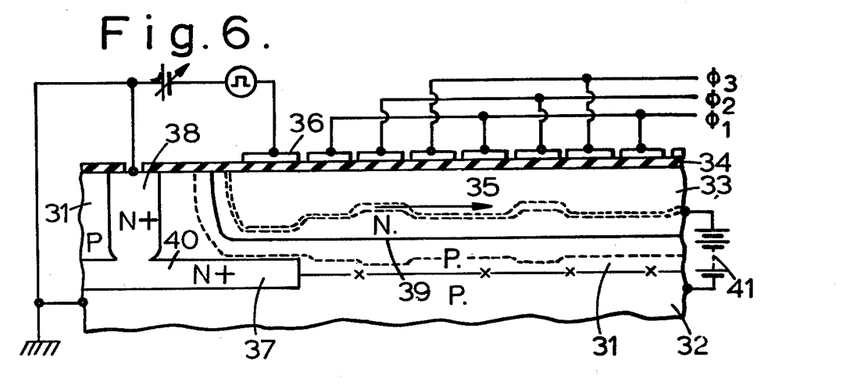
FIG. 6 shows a fifth embodiment of an arrangement in accordance with the invention and including a cross-sectional view of part of a different buried channel coupled device present in said arrangement.

Referring now to FIG. 6 there is shown another arrangement in accordance with the invention comprising a charge coupled device in which the stored charge carriers are majority carriers and charge transport is arranged to occur via the interior of the semiconductor layer. The device comprises a p-type epitaxial layer 31 of silicon of 10 ohm.cm. resistivity and approximately 9 microns thickness, said layer being provided on a p-type silicon substrate 32 also of 10 ohm.cm. resistivity. An n-type island surface region 33 of approximately 4 microns thickness is present in the epitaxial layer and is formed in a similar manner as the island region 21 in FIG. 5 by a surface implantation and drive-in step. The n-type island region 33 is laterally bounded within the body on all sides by the material of the p-type epitaxial layer 31 and is of such a doping and thickness that a depletion region may be formed extending throughout the thickness without breakdown occurring. On the surface of the layer 31 there is an insulating layer 34 of silicon oxide on which is present a system of transfer electrodes connected to a three-phase source of clock voltages. In the direction normal to the direction of charge transport in the island region 33 as indicated by the arrow 35 the transfer electrodes all extend across the entire width of the n-type island region 33. Adjacent one end of the island region 33 there is present on the insulating layer 34 an input gate electrode 36. In the vicinity of the interface between the epitaxial layer 31 and the substrate 32 as indicated by a chain line there is a locally provided n+-buried layer 37 of approximately 2 microns thickness. An n+-diffused surface region 38 extends through the epitaxial layer 31 in contact with the buried layer 37 and is provided with a connection conductor. The n+-buried layer 37 forms a source of charge carriers, that is electrons, to be stored and transported in the n-type island region 33.

The p-n junction 39 between the island region 33 and the epitaxial layer has, in operation of the arrangement, on opposite sides thereof a depletion region the boundaries of which is said island region and epitaxial layer are indicated in FIG. 6 by broken lines. Similarly the depletion regions formed in the island region below the input gate electrode 46 and the transfer electrodes are also indicated by broken lines.

The operation of the arrangement is similar to that described with reference to FIG. 5, the n+-source region 37, 38 being shorted to the p-type body part 31, 32 and sampled signals in the form of square wave pulses being applied to the input gate electrode 36 on a constant D.C. bias applied thereto. The distance between the adjoining parts of the p-n junction 39 and the p-n junction 40 between the n+-buried layer 37 and the p-type epitaxial layer 31 is approximately 4 microns. In the operation of the arrangement as a buried channel charge coupled device there will exist as a result of the applied potentials a reverse bias across the p-n junction 39 and this is diagrammatically indicated by the bias source 41 between the connections at the end of the body remote from the input gate electrode 36 and source region 37. The value of the constant D.C. bias applied to the input gate electrode 36 is such that the potential in the n-type region 33 below said electrode influences the depletion region associated with the p-n junction 39 to an extent whereby it is just on the point of punch-through to the zero-biased p-n junction 40. The superimposition of positive pulses on said D.C. bias is effective in causing the potential in the island region below the gate electrode 36 to become less negative and this effectively locally increases the extent of the depletion region of the junction 39 and causes punch-through to the junction 40 which becomes forward biased and electrons are injected into the storage site in the region 33 below the input gate electrode 36 in a similar manner as described in the previous embodiment. The sychronization of the sampled signal square wave pulses applied to the electrode 36 with the clocking voltages $\phi_1$ - $\phi_3$ is also as described in the previous embodiment. With this arrangement good linearity of charge introduced with respect to the magnitude of the input pulses may be obtained at least for small charge packets and low noise sensitivity is also a feature. It is alternatively possible to operate the arrangement with the sampled signals applied to the source region.

Many modifications are possible within the scope of the invention. For example the material of the semiconductor body may be other than silicon. Other configurations of charge coupled devices in which the charge is transported via the interior of the layer may be employed, for example structures in which the channel is formed in an n-type epitaxial layer on a p-type substrate. The means employed for laterally bounding the channel region in such an n-type layer will be chosen, inter alia, in accordance with the position of the source region of the charge carriers, for example when using a surface n-type region for such a source then the channel region at least where adjacent the source region has to be laterally bounded by p-type material in order to achieve the desired punch-through mode of charge introduction. In some instances, for example when using device structures of the form as shown in FIG. 3, it may be possible to operate the device in a self-sampling mode whereby an input analog signal is applied directly without the necessity to derive a series of input pulses from said signal.

What is claimed is:

1. A charge coupled circuit arrangement comprising a charge coupled device having a semiconductor body comprising a region of one conductivity type in which charge carriers representative of information can be stored at a plurality of storage sites and transferred between successive storage sites from a first part of the region to a second part of the region, an input gate electrode for converting signal information into said charge carriers, a storage site associated with the input gate electrode, an insulating layer which separates the input gate electrode from the first part of the region, a further region in the semiconductor body which forms a source of charge carriers to be stored and transported, said source region being separated from the storage site associated with the input gate electrode by at least one rectifying barrier bounding said source region and having a zero-bias small depletion region, drive circuit means connected to the device for effecting the transfer of charge between storage sites, and input circuit means including connections to the input gate electrode and source region for converting signal information into an input of charge into the storage site associated with the input gate electrode by causing a depletion region which is formed at least in part adjacent said storage site to punch-through to the source region to effect introduction of charge carriers from said source region into said storage site, said depletion region adjacent said storage site being spaced apart from said zero-bias small depletion region until it reaches equilibrium, the transport of charge carriers being arranged to occur via the interior of the region of one conductivity type, said region at least during operation being isolated from the surroundings thereof, the source region being of the same conductivity type as said region in which charge storage and transport is effected and being separated therefrom by a region of the opposite conductivity type, the semiconductor body region of one conductivity type comprising a surface layer of one conductivity type, said surface layer having a thickness and doping concentration such that a depletion region can be obtained throughout the thickness of the surface layer by means of an electric field while avoiding breakdown, an electrode system at at least one side of the surface layer for the capacitive production of electric fields in the surface layer by means of which charge can be transported from a first part of the surface layer to a second part of the surface layer in the lateral direction of the surface layer via the interior of the surface layer, said input gate electrode being separated from the first part of the surface layer by said insulating layer, said surface layer of the one conductivity type being laterally bounded in the semiconductor body at least in the vicinity of the location of the input gate electrode by a region of the opposite conductivity type, said region of the opposite conductivity type separating the first part of the surface layer from a surface region of the one conductivity type which forms the source region, and ohmic connections at least to the source region and to the region of the opposite conductivity type.

2. A charge coupled circuit arrangement as claimed in claim 1, further comprising means for connecting the source region of the one conductivity type and the semiconductor body part of the opposite conductivity type at the same potential, and means for applying input signal information to the input gate electrode.

3. A charge coupled circuit arrangement comprising a charge coupled device having a semiconductor body comprising a region of one conductivity type in which charge carriers representative of information can be stored at a plurality of storage sites and transferred between successive storage sites from a first part of the region to a second part of the region, an input gate electrode for converting signal information into said charge carriers, a storage site associated with the input gate electrode, an insulating layer which separates the input gate electrode from the first part of the region, a further region in the semiconductor body which forms a source of charge carriers to be stored and transported, said source region being separated from the storage site associated with the input gate electrode by at least one rectifying barrier bounding said source region and having a zero-bias small depletion region, drive circuit means connected to the device for effecting the transfer of charge between storage sites, and input circuit means including connections to the input gate electrode and source region for converting signal information into an input of charge into the storage site associated with the input gate electrode by causing a depletion region which is formed at least in part adjacent said storage site to punch-through to the source region to effect introduction of charge carriers from said source region into said storage site, said depletion region adjacent said storage site being spaced apart from said zero-bias small depletion region until it reaches equilibrium, the transport of charge carriers being arranged to occur via the interior of the region of one conductivity type, said region at least during operation being isolated from the surroundings thereof, the source region being of the same conductivity type as said region in which charge storage and transport is effected and being separated therefrom by a region of the opposite conductivity type, the semiconductor body region of one conductivity type comprising a surface layer of one conductivity type and the semiconductor body comprising an underlying body part of the opposite conductivity type, said surface layer being laterally bounded in the semiconductor body and having a thickness and doping concentration such that a depletion region can be obtaned throughout the thickness of the surface layer by means of an electric field while avoiding breakdown, an electrode system adjacent the surface of the surface layer for the capacitive production of electric fields in the surface layer by means of which charge can be transported from a first part of the surface layer to a second part of the surface layer in the lateral direction of the surface layer via the interior of the surface layer, said input gate electrode being separated from a first part of the surface layer by said insulating layer, said source region comprising a buried layer of the one conductivity type extending in said underlying body part of the opposite conductivity type at least below the input gate electrode, and ohmic connections at least to the source region of the one conductivity type and to the underlying body part of the opposite conductivity type.

4. A charge coupled circuit arrangement as claimed in claim 3, further comprising means for connecting the source region of the one conductivity type and the semiconductor body part of the opposite conductivity type at the same potential, and means for applying input signal information to the input gate electrode.

* * * * *